United States Patent
Kido et al.

(10) Patent No.: US 6,960,398 B2
(45) Date of Patent: Nov. 1, 2005

(54) CHARGE TRANSPORTING MATERIAL, ORGANIC ELECTROLUMINESCENT ELEMENT, AND LIGHT EMITTING PANEL

(75) Inventors: Junji Kido, Yonezawa (JP); Satoshi Suzuki, Tokyo (JP); Kiyoshi Itoh, Tokyo (JP)

(73) Assignee: Dai Nippon Printing Co., Ltd, Tokyo-to (JP)

( * ) Notice: Subject to any disclaimer, the term of this patent is extended or adjusted under 35 U.S.C. 154(b) by 0 days.

(21) Appl. No.: 10/757,783

(22) Filed: Jan. 15, 2004

(65) Prior Publication Data

US 2004/0258953 A1 Dec. 23, 2004

(30) Foreign Application Priority Data

Jan. 16, 2003 (JP) ........................................ 2003-008873
Jan. 16, 2003 (JP) ........................................ 2003-008874

(51) Int. Cl.[7] ........................ H05B 33/14; C08F 226/06
(52) U.S. Cl. .................. 428/690; 429/917; 252/301.16; 313/504; 313/506; 526/259; 526/280; 526/256
(58) Field of Search ................................ 428/690, 917; 313/504, 506; 257/40; 526/259, 280, 256; 252/301.16

(56) References Cited

FOREIGN PATENT DOCUMENTS

| JP | 61-173255 A | * | 8/1986 |
| JP | 2003-178884 A | * | 6/2003 |
| WO | WO 03/076548 A1 | * | 9/2003 |

OTHER PUBLICATIONS

Ostrauskaite et al., Polymer Bulletin, (49), p. 95–101 (2002).*
Sasakawa et al., Macromolecules, vol. 22, p. 4253–4259, (1989).*

* cited by examiner

Primary Examiner—Dawn L. Garrett
(74) Attorney, Agent, or Firm—Timothy J. Keefer; Seyfarth Shaw LLP

(57) ABSTRACT

A charge transporting material provided by the present invention comprising a compound, a molecular structure of which has at least one repeating unit represented by the following formula (1):

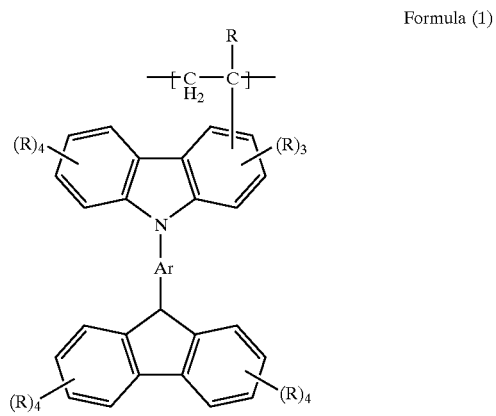

Formula (1)

wherein, Ar is a non-substituted or substituted arylene group having 6 or more to 60 or less carbon atoms related to a conjugated bond or a non-substituted or substituted heterocyclic group having 4 or more to 60 or less carbon atoms related to a conjugated bond, and wherein, each R may be independently selected from the group consisting of hydrogen atom, alkyl group having 1 to 20 carbon atoms, alkoxyl group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxyl group having 6 to 60 carbon atoms, arylalkyl group having 7 to 60 carbon atoms, arylalkoxyl group having 7 to 60 carbon atoms, arylalkenyl group having 8 to 60 carbon atoms, arylamino group having 6 to 60 carbon atoms, heterocyclic group having 4 to 60 carbon atoms, cyano group, nitro group, and halogen atoms.

14 Claims, 2 Drawing Sheets

(a)

(b)

(c)

CHARGE TRANSPORTING MATERIAL, ORGANIC ELECTROLUMINESCENT ELEMENT, AND LIGHT EMITTING PANEL

BACKGROUND OF THE INVENTION

1. Field of the Invention

The present invention relates to a novel polymer material having charge transporting ability, which is applicable to various organic electro elements and devices utilizing the charge transporting function, such as photosensitive device for electrophotography, organic electroluminescent element, photorefractive element, electrochromic element, photosensor, solar battery or the like.

The present invention also relates to an organic electroluminescent element utilizing such novel polymer material having charge transporting ability, and further relates to a light emitting panel provided with such organic electroluminescent element.

2. Description of the Related Art

Charge transporting materials are materials having charge transporting ability. When charge is injected in the charge transporting material, the injected charge causes charge-concentration gradient or electromagnetic gradient within the material to lead diffusion or movement of charge, thereby exhibiting charge transporting activity. The term of "charge transporting material(s)" includes both meanings of an electron transporting material having ability of transporting electrons as charge and a hole transporting material having ability of transporting holes as charge. The charge transporting materials has been extensively investigated because it is important to produce organic electro elements and devices such as photosensitive device for electrophotography, organic electroluminescent element, photorefractive element, electrochromic element, photosensor, solar battery or the like.

For basic properties of the charge transporting materials, it is required: to be receptive to either one or both of electron and hole when it is in a neutral condition; to be high in the charge transporting ability; to be easily formed into a film-like form; and to be stable when it is formed into an amorphous film.

Since the charge transporting materials are often used as a uniform film, it is important to be easily formed into a film-like form. In a case where the charge transporting material is low molecular compound and formed into a film with 1 μm or less of thickness, vacuum deposition process is generally used as film-forming method. The vacuum deposition process however needs a depositing apparatus which is rather large-scale or strict than coating process to lead high cost, and use of the depositing apparatus also causes difficulty of producing a large substrate. In addition, when the low molecular compound is solely used to form a film, the film thus formed is inferior in mechanical strength or thermal stability. For these reasons, a coating technique is adapted in some cases, in which a film of the charge transporting material is formed by dispersing the low molecular compound in high molecular polymer as a binder, and coating with it.

On the other hand, most of the charge transporting materials are hole transporting materials, for which tertiary amine derivatives such as triarylamine or the like are extensively used. Electron transporting materials of applicable level include only a few sorts in comparison with the hole transporting materials because the electron transporting materials are not so high in solubility to an organic solvent and therefore not suitable to coating process for formation of film and also not so high in mobility of electron.

Among the charge transporting materials, there are those having bipolar property provided with both of hole and electron transporting functions. One of examples is CBP, namely 4,4'-Bis(Carbazol-9-yl)-biphenyl (Japanese Patent Application Laid-open No. Hei. 10-168443). In addition to the bipolar property, the CBP further has high transparency, and high matching to a light emitting dopant when the charge transporting material is used for the organic electroluminescent element. Therefore, the CBP is preferably used for an organic electroluminescent element using a phosphorescence dopant (M. A. Baldo et al., "Nature", (2000), vol.403, p. 750).

However, the vacuum deposition process is still utilized as a major method to form the film or layer of the charge transporting materials such as the CBP. Moreover, since molecules of the CBP tend to form a plane structure, an amorphous film of the CBP is easily crystallized by time passing or heat. Therefore, in a case of using the CBP for an electronic device which is attended with heating generation of the Joule heat, such as the organic electroluminescent element, there is a defect that large amount (about 5 to 10 percent) of doping is required or that mixing of the binder is required for prevention of crystallization. For these reasons, it is difficult to form the film or layer by solely coating with the CBP.

Turning the attention to electroluminescent elements (hereinafter, "electroluminescent" will be simply referred as "EL".), the EL elements utilize light emission in the electric field, and have several advantageous characteristics of being adaptable to a thin and compact design, having a high visibility and a wide angle of visibility because of self-light emission, being good in impact resistance because it is really in the solid state. Thus the EL elements are expected to be utilized as a light emitting element of various displaying device. Among the EL elements, there are inorganic EL elements using inorganic compound as light emitting material and organic EL elements using organic compound as light emitting material.

In particular, the organic EL elements can remarkably lower the voltage to be impressed as well as having easiness of size-reduction, whereby enabling reduction of the electric power consumption. In addition, it enables light emission from plane and light emission of three primary colors. Thus the organic EL elements are subjected to investigation for developing a next generation of light emitting element.

For a layered structure of the organic EL elements, a fundamental structure is "a positive electrode/an organic light emitting layer/a negative electrode", and there are known other structures which are further provided with a hole injection transporting layer and/or an electron injection layer at a proper position, such as "a positive electrode/a hole transporting layer/an organic light emitting layer/a negative electrode", and "a positive electrode/a hole transporting layer/an organic light emitting layer/an electron injection layer/a negative electrode".

The conventional organic EL elements utilize light emission taken from fluorescent material. The organic EL elements take energy in an excited state as light emission, the excited state being caused by recombination of electrons and holes injected in the element. The excited state caused is considered to include 25% of singlet state and 75% of triplet state. In the organic EL elements utilizing fluorescence, only the energy of singlet state is utilized, and therefore inner quantum efficiency is restricted within 25% according to the principle. Attentions are now imposed on organic EL elements utilizing phosphorescence. The phosphorescent organic EL elements can utilize the energy of triplet state as well as that of singlet state, and it enables the inner quantum efficiency to rise up to 100% according to the principle. In the phosphorescent organic EL element, a light emitting material comprising metallic complex containing heavy metal such as platinum, iridium or the like is used as a dopant emitting phosphorescence, and a host material is doped with such light emitting material to take the phosphorescent emission (M. A. Baldo et al., "Nature", (1998), vol.395, p.151; M. A. Baldo et al., "Apllied Physics Letters", (1999), vol.75, p.4; M. A. Baldo et al., "Nature", (2000), vol.403, p.750).

Light emission by the phosphorescent dopant has relativity to the host material. Basic properties required to the host material include: a hole or electron transporting ability; a reduction potential of the host material higher than that of the phosphorescent dopant; an energy level of triplet state of the host material lower than a reduction potential of the dopant; or the like, and CBP, namely 4,4'-Bis(Carbazol-9-yl)-biphenyl (Japanese Patent Application Laid-open No. Hei 10-168443), is preferably used in general.

However, charge transporting materials such as the CBP which are used as the host material for the organic EL element utilizing the phosphorescence emitting material is liable to crystallize, and there are defects that a large amount (about 5 to 10 percent) of doping for prevention of crystallization, or that the film- or layer-formation through the coating process is difficult. Therefore, it is difficult to produce the organic EL element having high efficiency of light emission by the coating process using the CBP.

SUMMARY OF THE INVENTION

In view of this circumstances, a first object of the present invention is to provide a novel charge transporting material, which is excellent in charge transporting ability, hard to crystallize, capable of forming a film or layer by coating process, and highly adaptable to electronic devices.

In addition, a second object of the present invention is to provide an organic EL element which is hard to crystallize, easy to be formed into a film or layer by coating process, and capable of using phosphorescence emitting material as the dopant to obtain high efficiency of light emission. The second object is also to provide a light emitting panel provided with such organic EL element and having high efficiency of light emission.

A charge transporting material according to the present invention comprises a compound, a molecular structure of which has at least one repeating unit represented by the following formula (1):

Formula (1)

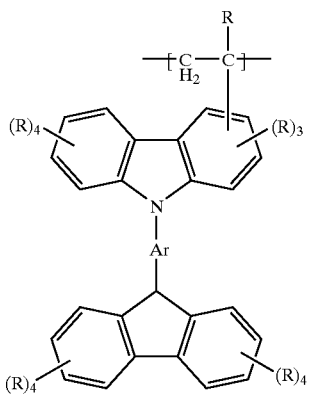

wherein, Ar is a non-substituted or substituted arylene group or a non-substituted or substituted heterocyclic group, the arylene group having 6 or more to 60 or less carbon atoms and forming a conjugated bond system extending over a region between two nitrogen atoms, the heterocyclic compound having 4 or more to 60 or less carbon atoms and also forming a conjugated bond system extending over a region between two nitrogen atoms, and wherein, each R may be different or same, and selected from the group consisting of hydrogen atom, alkyl group having 1 to 20 carbon atoms, alkoxyl group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxyl group having 6 to 60 carbon atoms, arylalkyl group having 7 to 60 carbon atoms, arylalkoxyl group having 7 to 60 carbon atoms, arylalkenyl group having 8 to 60 carbon atoms, arylamino group having 6 to 60 carbon atoms, heterocyclic group having 4 to 60 carbon atoms, cyano group, nitro group, and halogen atoms.

It is preferable that total number of the repeating units represented by the formula (1) contained in the molecular of the compound is 5 to 100,000 in the view point of securing charge transporting ability and film-forming ability.

An organic electroluminescent element according to the present invention comprises a pair of electrodes and an organic compound layer having a mono-layered or multi-layered structure and disposed between the electrodes, wherein at least one layer in the organic compound layer contains at least one compound, a molecular structure of which has at least one repeating unit represented by the formula (1) described above.

When the organic compound layer is a light emitting layer comprising at least one light emitting material dispersed in the compound having at least one repeating unit represented by the formula (1), color of the light emission can be easily changed by changing the light emitting material, thus being preferable.

In particular, the light emitting layer comprising a phosphorescent iridium compound as the light emitting material at 0.5 to 20% by weight can utilize the energy of triplet state, and therefore it is preferable in the view point of attaining high efficiency of the light emission.

When a layer comprising an electron transporting compound is disposed between the light emitting layer and the negative electrode in a manner that the layer is adjacent to the light emitting layer and the negative electrode, the electrons are easily injected in the organic EL element, thus being preferable.

It is also preferable that a layer comprising a hole transporting compound is disposed between the light emitting layer and the positive electrode in a manner that the layer is adjacent to the light emitting layer and the positive electrode because the holes are easily injected in the organic EL element.

Further, it is more preferable that the organic electroluminescent element is provided with both of the layers, one of which is the layer comprising an electron transporting compound disposed between the light emitting layer and the negative electrode in a manner of placing the layer adjacently to the light emitting layer and the negative electrode, and the other of which is the layer comprising a hole transporting compound disposed between the light emitting layer and the positive electrode in a manner of placing the layer adjacently to the light emitting layer and the positive electrode, in the view points of facilitating injection of the electrons and the holes and keeping the balance between numbers of the electrons and the holes.

Still further, a light emitting panel according to the present invention is provided with the above-mentioned organic electroluminescent element.

Figure 1:
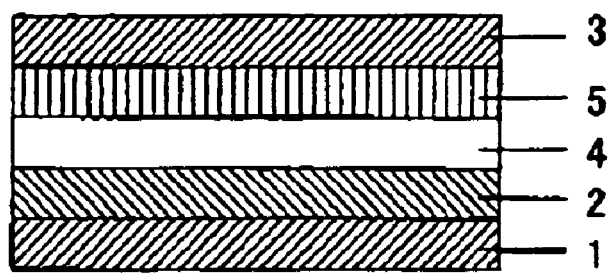
FIG. 1 schematically shows a sectional view in one example of the organic EL element according to the present invention.
Figure 1:
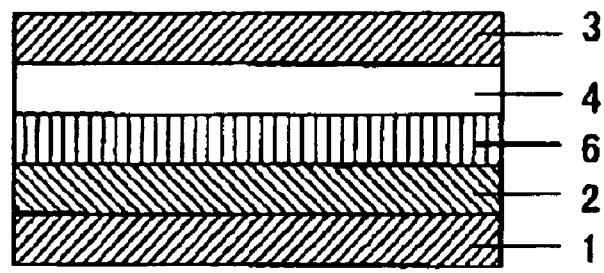
Figure 1:
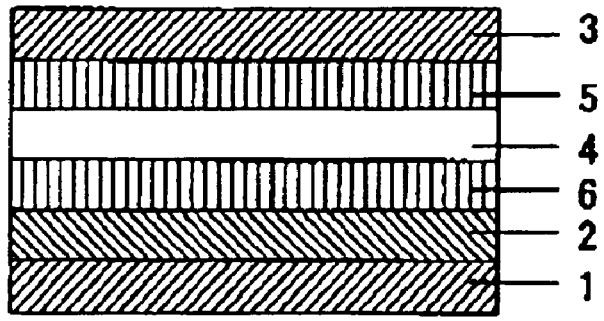

In the drawings, numerical symbols mean as follows.

1: a substrate (glass), 2: a positive electrode (ITO), 3: a negative electrode (metal electrode), 4: a light emitting layer, 5: an electron transporting layer, 6: a hole transporting layer

DETAILED DESCRIPTION OF THE PREFERRED EMBODIMENT

The present invention will be described in detail hereafter. A compound to be used as a major ingredient of charge transporting material contains, in its molecular structure, one or more repeating units represented by the following formula (1):

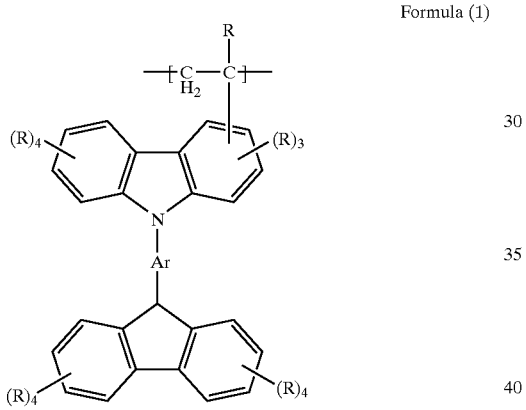

Formula (1)

The "Ar" in the formula is selected from the group consisting of arylene group and heterocyclic group. The arylene group to be selected has 6 to 60 carbon atoms (namely, number of carbon atoms is 6 or more and 60 or less) and it forms a conjugated bond system (Hereinafter, having formed a conjugated bond system may be written as "related to conjugated bond".). The conjugated bond system extends over a region between two nitrogen atoms of respective carbazole rings to form a united conjugated bond system spreading over the carbazole rings. The heterocyclic group has 4 or more to 60 or less carbon atoms, and it also forms a conjugated bond system extending over a region between two nitrogen atoms. The arylene group and the heterocyclic group may be non-substituted or substituted.

Concrete examples of the Ar include aromatic groups represented by the following formulas (a) to (j) and groups derived from such aromatic groups.

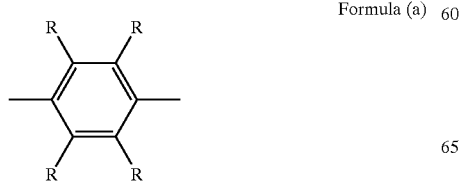

Formula (a)

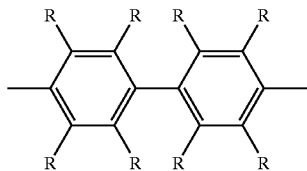

Formula (b)

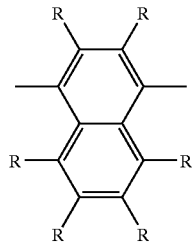

Formula (c)

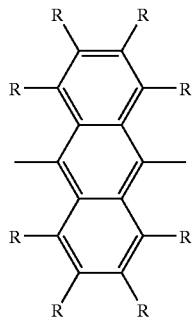

Formula (d)

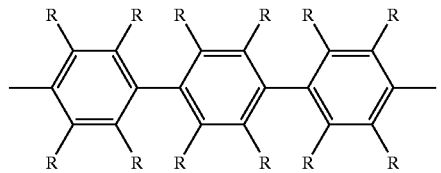

Formula (e)

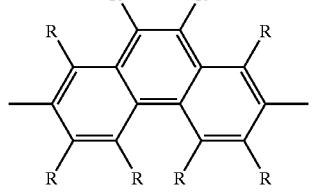

Formula (f)

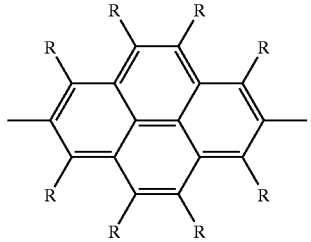

Formula (g)

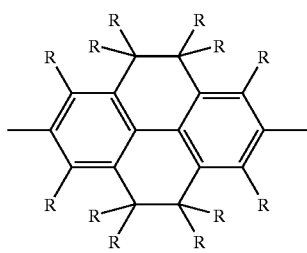

Formula (h)

Formula (i)

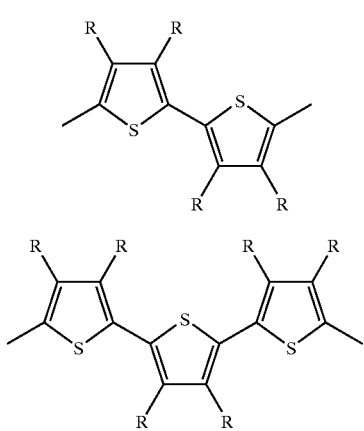

Formula (k)

Preferable ones of these are the groups of 1,4-phenylene, 4,4'-biphenylene and 4,4"-terphenylene, and groups derived from these preferable groups.

The "R" appearing in the exemplified formulas of Ar and the formula (1) is selected from the group consisting of hydrogen atom, alkyl group having 1 to 20 carbon atoms, alkoxyl group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxyl group having 6 to 60 carbon atoms, arylalkyl group having 7 to 60 carbon atoms, arylalkoxyl group having 7 to 60 carbon atoms, arylalkenyl group having 8 to 60 carbon atoms, arylamino group having 6 to 60 carbon atoms, heterocyclic group having 4 to 60 carbon atoms, cyano group, nitro group, and halogen atoms. The respective "R"s present in the same repeating unit may be different from or same as each other.

As the alkyl group having 1 to 20 carbon atoms, there may be exemplified methyl, ethyl, n-propyl, i-propyl, n-butyl, i-butyl, sec-butyl, t-butyl, n-pentyl, n-hexyl, n-octyl, nonyl, decyl, and lauryl, and preferable examples include pentyl group, hexyl group, octyl group and decyl group.

As the alkoxyl group having 1 to 20 carbon atoms, there may be exemplified methoxy, ethoxy, propyloxy, butoxy, pentyloxy, hexyloxy, heptyloxy, octyloxy, nonyloxy, decyloxy and lauryloxy, and preferable examples include pentyloxy group, hexyloxy group, octyloxy group and decyloxy group.

As the alkylthio group having 1 to 20 carbon atoms, there may be exemplified methylthio, ethylthio, propylthio, butylthio, pentylthio, hexylthio, heptylthio, octylthio group, nonylthio, decylthio and laurylthio, and preferable examples include pentylthio group, hexylthio group, octylthio group and decylthio group.

As the alkylsilyl group having 1 to 60 carbon atoms, there may be exemplified methylsilyl, ethylsilyl, propylsilyl, butylsilyl, pentylsilyl, hexylsilyl, heptylsilyl, octylsilyl, nonylsilyl, decylsilyl, laurylsilyl, trimethylsilyl, ethyldimethylsilyl, propyldimethylsilyl, butyldimethylsilyl, pentyldimethylsilyl, hexyldimethylsilyl, heptyldimethylsilyl, octyldimethylsilyl, nonyldimethylsilyl, decyldimethylsilyl and lauryldimethylsilyl, and preferable examples include pentylsilyl group, hexylsilyl group, octylsilyl group, decylsilyl group, pentyldimethylsilyl group, hexyldimethylsilyl group, octyldimethylsilyl group and decyldimethylsilyl group.

As the alkylamino group having 1 to 40 carbon atoms, there may be exemplified methylamino, ethylamino, propylamino, butylamino, pentylamino, hexylamino, heptylamino, octylamino, nonylamino, decylamino, laurylamino, dimethylamino and diethylamino, and preferable examples include pentylamino group, hexylamino group, octylamino group and decylamino group.

As the aryl group having 6 to 60 carbon atoms, there may be exemplified phenyl, $C_1$–$C_{12}$ alkoxyphenyl group (Herein, the "$C_1$–$C_{12}$" means number of carbon atoms being in a range of 1 to 12.), $C_1$–$C_{12}$ alkylphenyl, 1-naphtyl and 2-naphtyl, and preferable examples include $C_1$–$C_{12}$ alkoxyphenyl group and $C_1$–$C_{12}$ alkylphenyl group.

As the aryloxyl group having 6 to 60 carbon atoms, there may be exemplified phenoxy, $C_1$–$C_{12}$ alkoxyphenoxy, $C_1$–$C_{12}$ alkylphenoxy, 1-naphtyloxy and 2-naphtyloxy, and preferable examples include $C_1$–$C_{12}$ alkoxyphenoxy group and $C_1$–$C_{12}$ alkylphenoxy group.

As the arylalkyl group having 7 to 60 carbon atoms, there may be exemplified phenyl-$C_1$–$C_{12}$alkyl, $C_1$–$C_{12}$ alkoxyphenyl-$C_1$–$C_{12}$ alkyl, $C_1$–$C_{12}$ alkylphenyl-$C_1$–$C_{12}$ alkyl, 1-naphtyl-$C_1$–$C_{12}$ alkyl, 2-naphtyl-$C_1$–$C_{12}$ alkyl, and preferable examples include $C_1$–$C_{12}$ alkoxyphenyl-$C_1$–$C_{12}$ alkyl group and $C_1$–$C_{12}$ alkylphenyl-$C_1$–$C_{12}$ alkyl group.

As the arylalkoxyl group having 7 to 60 carbon atoms, there may be exemplified phenyl $C_1$–$C_{12}$ alkoxy, $C_1$–$C_{12}$ alkoxyphenyl-$C_1$–$C_{12}$ alkoxy, $C_1$–$C_{12}$alkylphenyl-$C_1$–$C_{12}$ alkoxy, 1-naphtyl-$C_1$–$C_{12}$ alkoxy, 2-naphtyl-$C_1$–$C_{12}$ alkoxy, and preferable examples include $C_1$–$C_{12}$ alkylphenyl-$C_1$–$C_{12}$ alkoxy group.

As the arylalkenyl group having 8 to 60 carbon atoms, there may be exemplified phenyl $C_1$–$C_{12}$ alkenyl, $C_1$–$C_{12}$ alkoxyphenyl-$C_1$–$C_{12}$ alkenyl, $C_1$–$C_{12}$ alkylphenyl-$C_1$–$C_{12}$ alkenyl, 1-naphtyl-$C_1$–$C_{12}$ alkenyl and 2-naphtyl-$C_1$–$C_{12}$ alkenyl, and preferable examples include $C_1$–$C_{12}$ alkoxyphenyl-$C_1$–$C_{12}$ alkenyl group and $C_1$–$C_{12}$ alkylphenyl-$C_1$–$C_{12}$ alkenyl group.

As the arylamino group having 6 to 60 carbon atoms, there may be exemplified phenylamino, diphenylamino, $C_1$–$C_{12}$ alkoxyphenylamino, di($C_1$–$C_{12}$ alkoxyphenyl)amino, di($C_1$–$C_{12}$ alkylphenyl)amino and 1-naphtylamino, 2-naphtylamino, and preferable examples include $C_1$–$C_{12}$ alkylphenylamino group, di($C_1$–$C_{12}$ alkylphenyl)amino group.

As the heterocyclic group having 4 to 60 carbon atoms, there may be exemplified thienyl, $C_1$–$C_{12}$ alkylthienyl, pyrrolyl, furyl, pyridyl and $C_1$–$C_{12}$ alkylpyridyl group, and preferable examples include $C_1$–$C_{12}$ alkylthienyl group and $C_1$–$C_{12}$ alkylpyridyl group.

As the halogen atom, there may be exemplified fluorine, chlorine, bromine, iodine or the like.

Among the examples of "R", substituents containing alkyl group may be straight, branched or cyclic chain, or may be combination thereof. Examples but are not straight chain include isoamyl group, 2-ethylhexyl group, 3,7-dimethyloctyl group, cyclohexyl group and 4-$C_1$–$C_{12}$ alkylcyclohexyl group.

At least one of the "R"s appearing in the exemplified formulas of the Ar and at least one of other "R"s appearing in the formula (1) may be bonded to each other to form a five-member or six-member ring which may be saturated or not. But the bonded portion may not form a cyclic structure.

Examples of the repeating unit represented by the formula (1) include the units represented by the following formulas (2) to (9).

Formula (2)
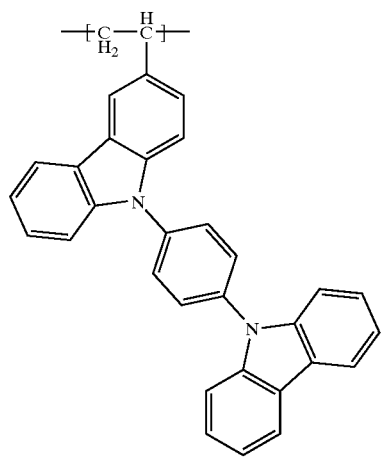
Formula (3)
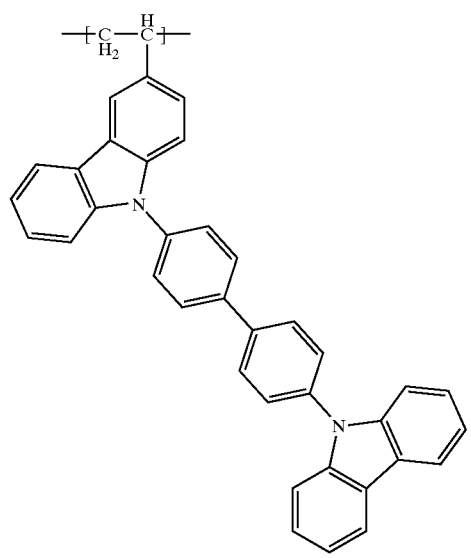
Formula (4)
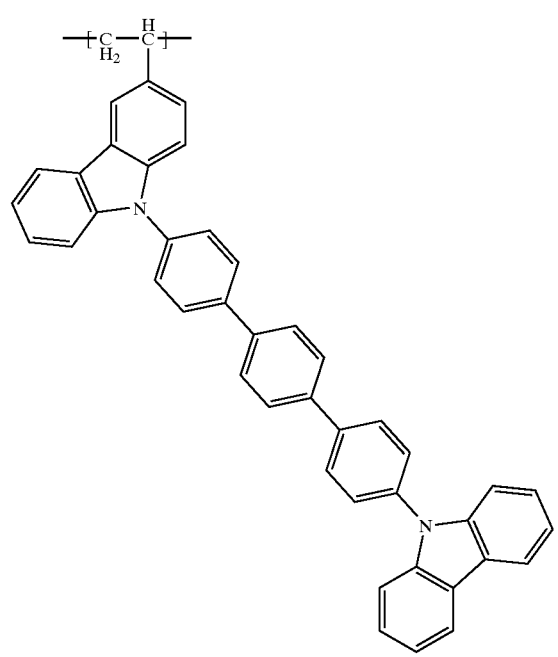
Formula (5)
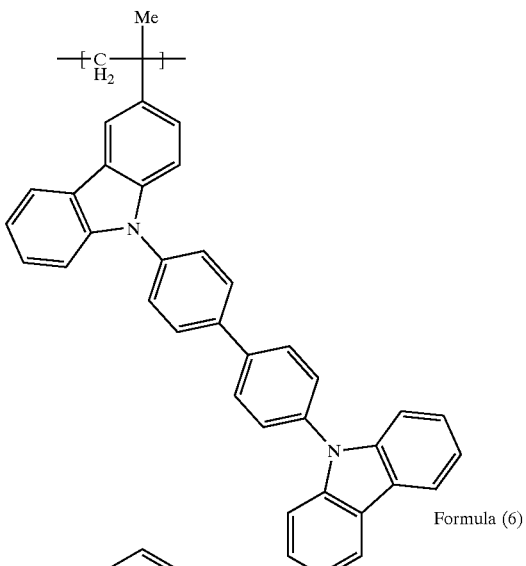
Formula (6)
Formula (7)
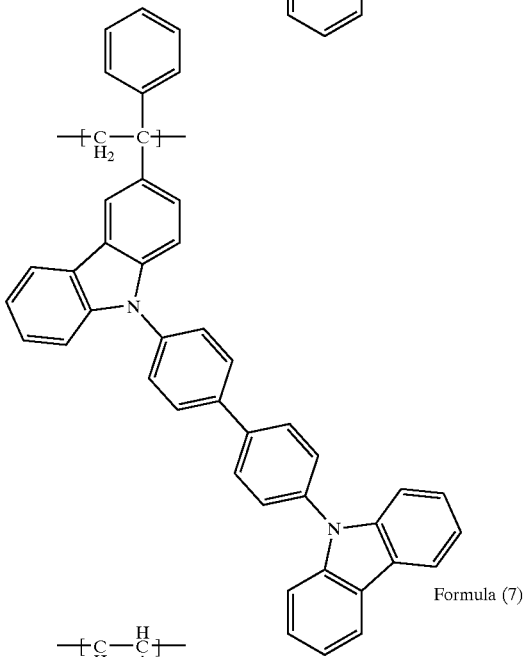

Formula (8)

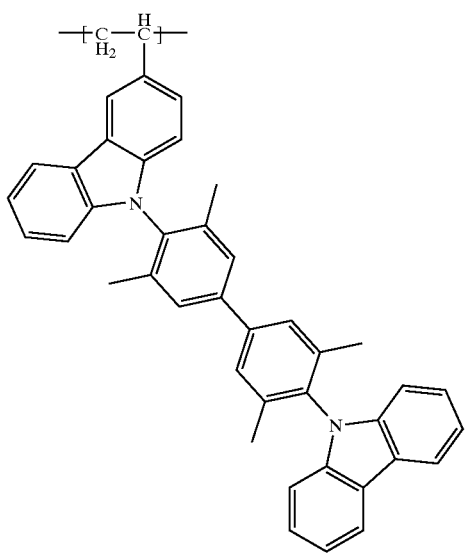

Formula (9)

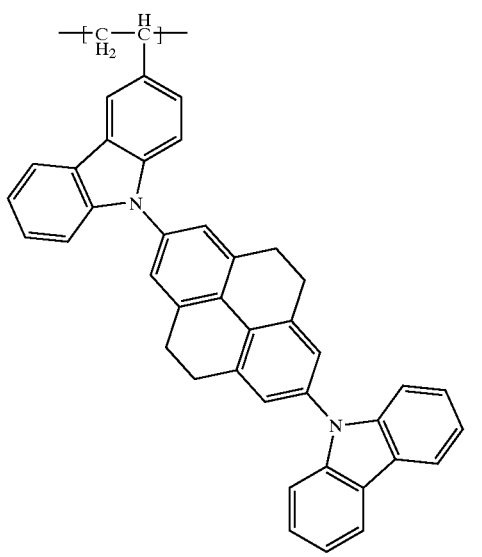

On the use of polyvinylcarbazole which is common as the hole transporting material, there is known a problem that the adjacent carbazole groups are liable to stack up and form an excimer. Formation of the excimers causes some problems that the excimers serve as a trap for charge to obstruct the transport of charge, or that the excimers serve as a quenching center when using it in combination with a light emitting material to obstruct the light emission.

In the preferable case of the present invention, "R" as the substituent selected from the above mentioned groups is introduced into a molecular structure of the charge transporting material to prevent the plural repeating units represented by the formula (1) from stacking up, thereby avoiding formation of the excimers.

Total number of the repeating units of the formula (1) contained in one molecular of the compound is preferably 5 to 100,000, more preferably 10 to 10,000, and still more preferably 20 to 5,000.

The compound used as the charge transporting material of the present invention has, in its molecular structure, at least one repeating unit selected from the formula (1). It may be a homopolymer consisting of the repeating units of the formula (1), or a copolymer using two or more kinds of the repeating units, all of which are selected from the formula (1), or further may be a copolymer using at least one kind of the repeating units of the formula (1) in combination with monomers other than the formula (1). In a case of being the copolymer, it may be a random, block or graft copolymer, or may be a polymer having an intermediate structure such as a random copolymer imparted with a block structure.

As a monomer which can be used to copolymerization with the repeating unit of the formula (1), there is not particularly limited. However, it is preferable if the repeating unit has a structure capable of preventing its solubility from lowering to organic solvents, or capable of preventing its charge transporting ability from lowering. For example, vinylcarbazole or vinyl(triphenylamine) may be preferable.

Amount ratio of the repeating unit of the formula (1) varies according to the structure of the used repeating unit, and a preferable range is generally 50 mol % or more and 100 mol % or less on the basis of total amount of monomer component as 100 mol %, and more preferable is 70 mol % or more and 100 mol % or less.

In the present invention, the compound as the charge transporting material varies its polymerization degree according to conditions such as a structure or amount ratio of repeating unit. However, number average molecular weight indicated with polystyrene standard is preferably in a range of $10^3$ to $10^8$, and if solubility and film-forming ability are considered, a range from $10^4$ to $10^6$ is more preferable. The molecular weight referred here is number average molecular weight measured by means of the gel permeation chromatography (GPC) using chloroform as the solvent and polystyrene as the standard.

When the compound of the present invention is copolymer, it may contain a structure or skeleton having the hole transporting function or the electron transporting function, which is located at a site of a repeating unit derived from other monomer, which is to be copolymerized with a monomer corresponding to the repeating unit of the formula (1). For example, there may be a copolymer containing polyvinylcarbazole skeleton having the hole transporting function, one concrete example of which is represented by the following formula (10):

Formula (10)

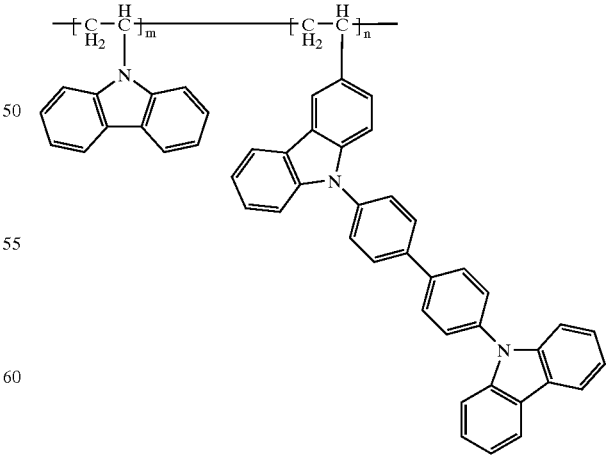

wherein, "m" and "n" are integer of 1 or more.

Furthermore, the compound of the present invention may contain a structure or skeleton having the light emitting function or other functions, which is located at a site of a repeating unit derived from other monomer, which is to be copolymerized with a repeating unit of the formula (1). Specifically, there may be exemplified a copolymer represented by the following formula (11):

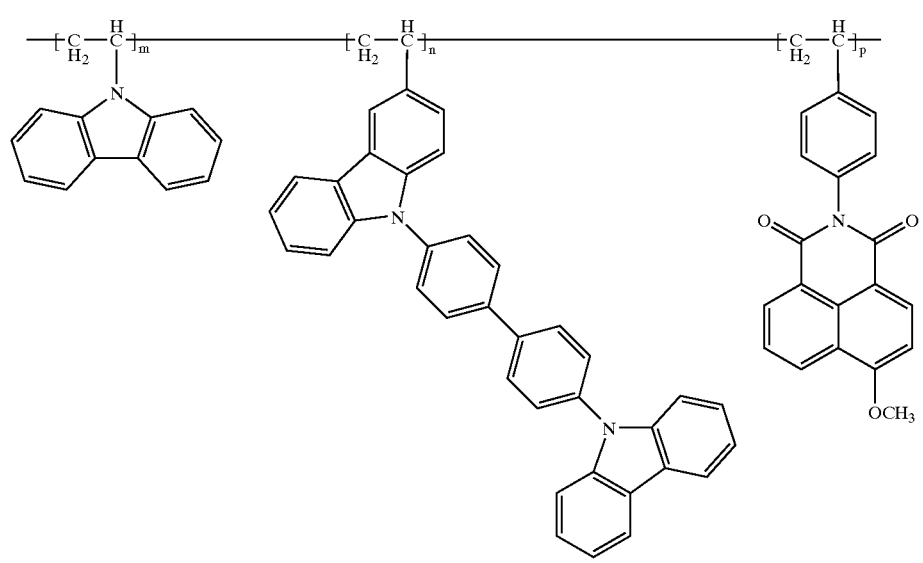

Formula (11)

wherein, "m", "n" and "p" are integer of 1 or more.

A polymerization method for producing the compound containing repeating unit of the formula (1) is not particularly limited. Adaptable methods include radical polymerization, ion polymerization or the like, and the radical polymerization process is preferable. As initiators for radical polymerization, there may be used azo compounds, peroxides or the like, and preferable initiators are azobisisobutyronitrile, derivatives of azobisisobutylic acid diester, and benzoyl peroxide.

A solvent for polymerization is also not particularly limited, and examples of the solvent include aromatic hydrocarbons (for example, benzene and toluene), halogenated hydrocarbons (for example, dichloroethane and chloroform), ethers (for example, tetrahydrofuran and dioxane), amides (for example, dimethylformamide and dimethylacetoamide), esters (for example, ethyl acetate), alcohols (for example, methanol), ketones (for example, acetone and cyclohexanone) or the like. Choice of the solvent enables either processes of the solution polymerization in which homogeneous polymerization is carried out and the precipitation polymerization in which a produced polymer is precipitated.

In a case of using these polymers as the charge transporting material for organic electro elements and devices, its purity affects the charge transporting property and the stability of amorphous state in the film or layer. Therefore, after the synthesizing of the polymer, it is desirably subjected to any purification treatment such as the purification through reprecipitation, the fractionation through chromatography or the like.

The charge transporting material of the present invention is dissolved in a solvent, and a film or layer can be formed through a coating process using the prepared coating liquid. Examples of good solvent for the charge transporting material include chloroform, methylene chloride, dichloroethane, tetrahydrofuran, toluene and xylene. In general, the charge transporting material can be dissolved in any one of these solvents at 0.1% by weight or more, though dissolving amount varies according to a structure or molecular weight of the charge transporting material. On the production of the electronic devices, a coating process is carried out with the use of a solution prepared from the charge transporting material which is soluble to the organic solvent, and thereafter the solvent is removed by drying, so that a layer or a film can be simply formed. Therefore, it is quite advantageous to production process.

Any coating method using a material in melted state, solution, dispersed liquid or mixed liquid of the charge transporting material is adaptable, and preferable methods are spin coating, cast coating, dip coating, die coating, bead coating, bar coating, roll coating, spray coating, gravure coating, flexo printing, screen printing, offset printing or the like.

In a case of forming the film or layer through coating process, the film or layer is heated and dried at preferably 30° C. to 300° C., and more preferably 60° C. to 200° C. in order to remove the solvent, and it is still more preferable to carry out this process under the reduced pressure or under the inert atmosphere.

Next, the organic EL element of the present invention will be described in detail hereafter.

In the present invention, the organic EL element comprises a pair of electrodes opposing to each other and an organic compound layer which is layered between the electrodes and has a mono-layered or multi-layered structure, and at least one layer in the organic compound layer contains at least one compound, a molecular structure of which has at least one repeating unit represented by the formula (1). Hereafter, such compound will be referred as "the compound of the formula (1)". For the present invention, a structure of the organic EL element is not particularly limited and a known structure for the conventional organic EL element can be taken, insofar as it has the fundamental structure described above.

For example, the present invention permits a structure in which the positive and the negative electrodes composing a pair are individually allotted to and disposed on both sides of a light emitting layer which is formed of a mixture containing the compound of the formula (1) and a light emitting material. Such structure may further have an electron transporting layer which contains an electron transporting material and is laminated between the negative electrode and the light emitting layer, and/or a hole transporting layer which contains a hole transporting material and is laminated between the positive electrode and the light emitting layer. Furthermore, a layer containing the compound of the formula (1) which serves as a charge transporting layer may be laminated on a light emitting layer containing the other light emitting material. The present invention also permits any case that the light emitting layer or the charge transporting layer is composed of single layer or plural layers.

When a layer containing at least one kind of the compounds of the formula (1) is used as a light emitting layer, the light emitting layer can be formed so as that at least one kind of light emitting material is dispersed in the compound of the formula (1), and light emitting materials conventionally known like as described hereafter can be used as the light emitting material for the present invention. A layer in which the compound of the formula (1) is dispersed in the other high molecular polymer compound can also be formed. The compound of the formula (1) can be used by mixing with the other charge transporting material.

As the other charge transporting materials, namely electron transporting materials or hole transporting materials to be used together, though any known materials can be used and they are not particularly limited, examples of the hole transporting materials include pyrazoline derivatives, arylamine derivatives, stilbene derivatives, triphenyldiamine derivatives or the like. On the other hand, examples of the electron transporting materials include various metal complexes prepared from the following compounds: oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, 8-hydroxyquinoline or its derivatives, or the like.

Among these, either one of the compound having electron transporting ability or the compound having hole transporting ability may be used, or both of them may be used together. Each of these compounds may be solely used, and two or more kinds of these compounds may be mixed and used.

A copolymer containing the repeating unit of the formula (1) and the unit which is derived from other monomers having charge transporting function may also be used. A copolymer represented by the formula (10) described below is one example of the copolymer containing the repeating unit of the formula (1) and the other repeating unit derived from a monomer which has a structure containing carbazole group having the hole transporting function:

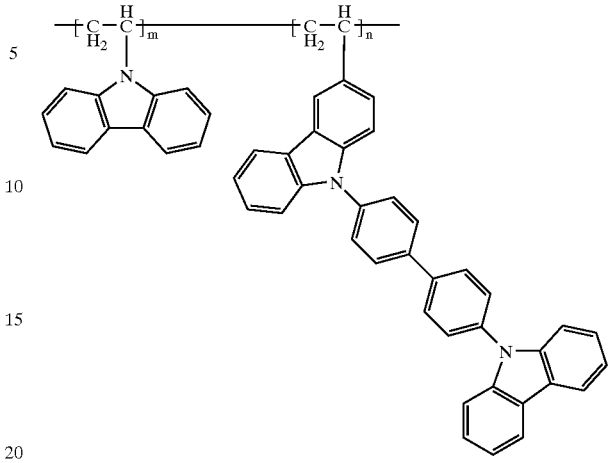

Formula (10)

wherein, "m" and "n" are integer of 1 or more.

A copolymer represented by the formula (12) described below is one example of the copolymer containing the repeating unit of the formula (1) and other repeating unit derived from a monomer which has a structure containing oxathiazole group having the electron transporting function:

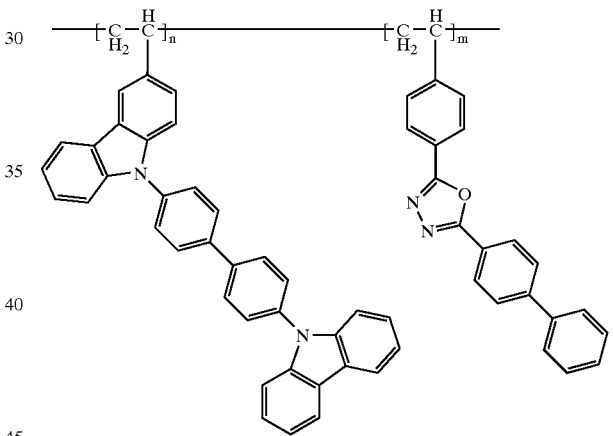

Formula (12)

wherein, "m" and "n" are integer of 1 or more.

Though light emitting materials which can be used for the organic EL element of the present invention are not particularly limited, examples thereof include: naphthalene derivatives; anthracene or its derivatives; perylene or its derivatives; coloring materials such as polymethines, xanthenes, coumarins and cyanines; aromatic amines; tetraphenylcyclopentadiene or its derivatives; tetraphenylbutadiene or its derivatives; nano-scale crystalline of semiconductor having value of band gap in a range of visible light such as CdSe and CdS; high molecular polymers having $\pi$ conjugated system such as poly-p-phenylene vinylene and polyfluorene; and metal complexes containing heavy metal such as platinum, iridium or the like. Among these, it is preferable to use a material having phosphorescence such as metal complex containing iridium.

Amount of the light emitting material in the light emitting layer is preferably 0.5% to 20% by weight, and more preferably 1% to 10% by weight. Iridium compound having phosphorescence emitting ability is particularly preferable, and it is incorporated into the light emitting layer at preferably 0.5% to 20% by weight, and more preferably 1% to 10% by weight.

Also, a copolymer containing the repeating unit of the formula (1) and other repeating unit derived from a monomer which has a structure having the light emitting function may be used. A copolymer represented by the formula (13) described below is one example of the copolymer containing the repeating unit of the formula (1) and the other repeating unit which has a structure of metal complex containing Iridium:

used for forming the positive electrode in the view point of the high conductive ability and the transparency.

Next, a layer as the light emitting layer which contains a compound of the formula (1) and a light emitting material is formed on the electrode. Any coating method using a material in melted state, solution, dispersed liquid or mixed liquid of these material is adaptable to form the layer, and preferable methods are spin coating, cast coating, dip coating, die coating, bead coating, bar coating, roll coating, spray coating, gravure coating, flexo printing, screen printing, offset printing or the like.

Formula (13)

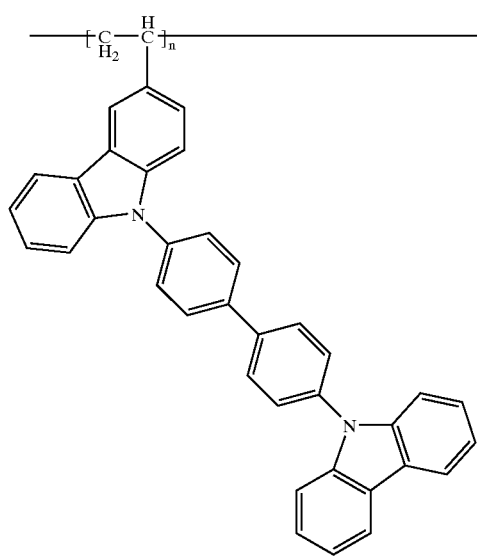
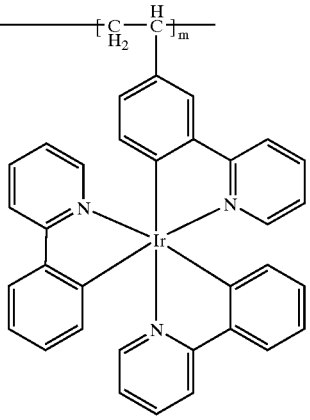

wherein, "m" and "n" are integer of 1 or more.

Typical examples of a method for producing the organic EL element of the present invention will be described hereafter. In order to obtain an organic EL element enabling light emission from plane, a pair of electrodes comprising a positive electrode and a negative electrode is desired that at least one of the electrodes is transparent or semitransparent so as to draw the light emission from the side where the transparent or semitransparent electrode is presented. However, in a case of embodiment which intends to draw light emission from an end face of the element, the electrodes are not restricted by such requirement.

As a substrate, various materials may be used, and examples thereof include glass plate made of quarts, soda glass or the like, a plate or foil made of metal, and plastics such as acrylic resins, styrene resins, polycarbonate resins or the like.

Among substrates and electrodes of the organic EL element, when a direction for drawing light emission is decided on a plane side of the organic EL element, the electrode disposed on the substrate is desired to be transparent or semitransparent.

As the electrodes, metal oxide layers, metal layers or a layer made of other material having conductive ability may be used. Specifically, there may be exemplified: conductive metal oxides such as stannic oxide, zinc oxide, indium oxide and indium tin oxide (ITO); metals such as gold, silver, chromium and nickel; organic conductive materials such as polyaniline, polythiophene and polypyrrole; mixture or lamination using two or more materials selected from these exemplified materials. In particular, the ITO is preferably Thickness of the light emitting layer is generally in a range from 1 nm to 1 µm, preferably 2 nm to 500 nm, and more preferably 5 nm to 500 nm.

In a case of forming the film or layer through coating process, the film or layer is heated and dried at preferably 30° C. to 300° C., and more preferably 60° C. to 200° C. in order to remove the solvent, and it is still more preferable to carry out this process under the reduced pressure or under the inert atmosphere.

In a case of laminating the light emitting layer and a layer of other charge transporting material, a hole transporting layer is formed on the positive electrode before the light emitting layer is formed by the method of film formation described above, or an electron transporting layer is formed after the light emitting layer is formed.

Though method for forming the charge transporting layer is not particularly limited, the vacuum deposition method which forms coating layer from a solid state material is adaptable, and a method forming a coating layer from a liquid state material such as melted material, solution, dispersed liquid or mixed liquid are also adaptable. As a coating method using the liquid state material, there may be carried out spin coating, cast coating, dip coating, die coating, bead coating, bar coating, roll coating, spray coating, gravure coating, flexo printing, screen printing, offset printing or the like.

Thickness of the charge transporting layer is generally in a range from 1 nm to 1 µm, preferably 2 nm to 500 nm, and more preferably 5 nm to 200 nm.

Next, the electrode of the other side is formed on the light emitting layer or the charge transporting layer. This electrode serves as a negative electrode. As materials for the negative electrode, those having a value of work function smaller than 4 eV are preferable in order to facilitate injection of electron. Examples of materials for the negative electrode include: alkali metals (for example, lithium, sodium and cesium) and halides thereof (for example, lithium fluoride, sodium fluoride, cesium fluoride, lithium chloride, sodium chloride and cecium chloride); alkaline earth metals (for example, calcium and magnesium) and halides thereof (for example, calcium fluoride, magnesium fluoride, calcium chloride and magnesium chloride); other metals such as aluminum and silver; conductive metal oxides; alloys or mixtures using two or more materials selected from these exemplified materials.

As a method for forming the negative electrode, vacuum deposition, sputtering or lamination to press and stick a metallic thin layer may be adapted.

After formation of the negative electrode, a protect layer may be furnished to protect the organic EL element. In order to use the organic EL element stably over a long period, a protect layer or a protect cover is desirably furnished to the element to protect it from outside. As a protect layer, high molecular polymer compounds, metal oxides, metal fluorides, metal borides, silicon oxides or silicon nitrides may be used. As a protect cover, there may be used a glass plate or a plastic plate whose surface is treated to reduce coefficient of water permeability, and a method to bond and seal the cover to a substrate of the element with thermosetting resin or photocurable resin is preferably adapted.

FIGS. 1(a) to (c) schematically show examples of sectional view of the organic EL element according to the present invention. For example, either one or both of the electrons and the holes can be easily injected in the organic EL element by:

like as FIG. 1 (i a), providing a layer containing compound having electron transporting ability between the light emitting layer and the negative electrode so as that such layer is adjacent to the light emitting layer and the negative electrode; or like as FIG. 1(b), providing a layer containing compound having hole transporting ability between the light emitting layer and the positive electrode so as that such layer is adjacent to the light emitting layer and the positive electrode; or like as FIG. 1(C), providing a layer containing compound having electron transporting ability between the light emitting layer and the negative electrode so as that such layer is adjacent to the light emitting layer and the negative electrode, as well as providing a layer containing compound having hole transporting ability between the light emitting layer and the positive electrode so as that such layer is adjacent to the light emitting layer and the positive electrode.

In order to obtain a plane-shaped element using the organic EL element of the present invention, a positive electrode and a negative electrode both of which are in a plane form are placed so as to be superimposed on each other.

In order to obtain a light emission having a certain pattern, there may be adapted some methods, such as a method that a mask having a window or opening shaped in a prescribed pattern is furnished on a surface of the light emitting element having a plane like form, or a method that a non-emitting portion (namely, a portion which is intended not to emit the light) of an organic layer is formed into extremely large thickness to make this portion substantially non-light-emissive, or a method that either one or both of the positive and the negative electrodes are formed into a prescribed pattern.

In order to produce a dot matrix element, there may be adapted a method that the positive and the negative electrodes are formed in a stripe pattern and made to cross each other at right angles, or a method that one of the positive and the negative electrodes is made to be selectively driven by TFT.

Moreover, plural organic EL elements whose colors of light emission are different from each other may be arranged on a same plane face to enable partial color display, multi-color display or full color display.

Thus, the organic EL element having high efficiency is easily obtained in comparison with the case of using the conventional CBP. Since the organic EL element of the present invention can be produced by film formation methods which is based on coating processes, it is also possible to allow the element to have a large display area.

The organic EL element of the present invention thus produced is bonded to a module which is obtained through a module process with an anisotropic conductive film or layer (ACF) by a proper method such as heat-pressing to obtain a light emitting panel of the present invention.

As described above, the charge transporting material of high molecular polymer according to the present invention is quite useful material for materials having charge transporting ability.

The charge transporting material of the present invention is easy to be synthesized, and it can be formed into a thin film or layer by coating process without doping or mixing of binder. Therefore, it is advantageous in comparison with a case of using the conventional CBP as the charge transporting material in the points that it has good stability and enables production of electro devices with low cost.

Moreover, the charge transporting material of the present invention has advantages that charge transporting ability thereof can be controlled in accordance with purposes by changing concentration of the repeating units of the formula (1), or by changing a kind of repeating unit of the formula (1), or by using a combination of two or more kinds of repeating units all of which fall in the formula (1) but are different from each other, and that coating suitability thereof can be improved and shape or configuration and electrical property of the layer can be optimized by introducing proper monomer to be copolymerized.

On the other hand, since the organic EL element according to the present invention is particularly characterized in that an organic light emitting element utilizing phosphorescence can be produced by coating process of film-forming methods, the organic EL element having high efficiency of light emission can be easily obtained in comparison with a case of using the conventional CBP. It is also possible to make the element having a large display area.

Moreover, since the light emitting panel according to the present invention is furnished with the organic EL element of the present invention which has high efficiency of light emission, the light emitting panel has also high efficiency of light emission.

EXAMPLES

Though the present invention will be hereinafter explained by way of examples, the scope of the present invention is not restricted by these examples.

Examples A Series

Example A1

<Synthesis of Charge Transporting Material>

0.80 g of phosphorus oxychloride was added into 50 mL of N,N-dimethylformamide and stirred at room temperature to be dissolved. Herein, a solution prepared by dissolving 2.42 g of CBP in 15 mL of dry chloroform was added and stirred at room temperature to obtain formyl-product of CBP (4-(Carbazol-9-yl)-4'-(3-formylcarbazol-9-yl)-biphenyl). On the other hand, 1.83 g of triphenylphosphine was added into 50 mL of benzene to be dissolved. Then 0.67 g of bromomethane was added therein and stirred at room temperature to produce phosphonium salt. The phosphonium salt thus obtained was dissolved in 50 mL of dry diethyl ether under dry nitrogen flow, and 4.4 mL of butyl lithium solution in hexane (1.6 M) was further added and stirred at room temperature to produce phosphoylide. Then 2.18 g of the formyl-product of CBP which is dissolved in 20 mL of dry diethyl ether was further added therein to allow Wittig reaction, thereby producing vinyl-product of CBP (4-(Carbazol-9-yl)-4'-(3-vinylcarbazol-9-yl)-biphenyl).

1.8 g of the vinyl-product of CBP was dissolved in 50 mL of dry tetrahydrofuran under dry nitrogen flow, and 3 mg of azobisisobutyronitrile was further added and stirred at room temperature for 12 hours to allow polymerization. Then the reacted solution was poured into 100 mL of methanol, and solid contents therein were washed by diluted hydrochloric acid. Thereafter, soluble components were removed by means of a Soxhlet reflux condenser using acetone as the solvent to separate an insoluble fraction. This insoluble fraction was dissolved in chloroform and subjected to reprecipitation using methanol, thus obtaining a target polymer (formula (14)). Hereafter, the obtained polymer is referred as the charge transporting material (1).

Formula (14)

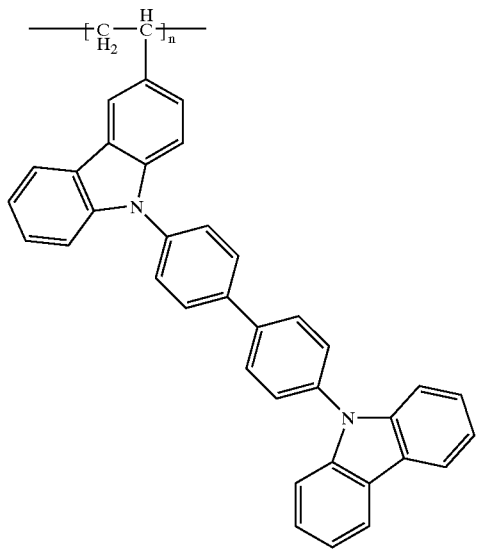

wherein, "n" is integer of 1 or more.

The charge transporting material (1) was soluble to aromatic solvents such as toluene and xylene, halogenated hydrocarbon solvents such as chloroform and 1,2-dichloroethane, and ether solvents such as tetrahydrofuran. Number average molecular weight of the charge transporting material (1) based on polystyrene standard was determined by gel permeation chromatography (GPC) using chloroform as solvent, and a determined value was $1.0 \times 10^4$. For a structure of the charge transporting material (1), corresponding spectra of 1H-NMR and IR spectrum were obtained.

Evaluation

<Evaluation for Film-forming Ability>

The charge transporting material (1) can be easily solved to chloroform. 2% by weight of charge transporting material (1) solution in chloroform was subjected to spin coating on a quartz substrate to form a thin layer of the charge transporting material (1) with thickness of 200 nm. The charge transporting material (1) can be formed into the thin layer by spin coating without doping or mixing of binder.

<Measurement of Energy Level>

The thin layer of the charge transporting material (1) obtained in the example was tested to measure work function and electron affinity. The work function was measured by means of an atmosphere-ultraviolet photoelectron spectrometer (AC-1 available from Riken Keiki Co., Ltd.) and a measured value was 5.53 eV. On the other hand, the electron affinity was calculated from the value of work function which was measured by the method described above and a value of band gap which was calculated from a value at an outermost end on a long wavelength side of absorption spectrum measured by means of an ultraviolet-visible spectrophotometer (MPC-3100 available from Shimazu Corporation), and a calculated value was 2.21 eV. These values were comparable to a work function of CBP (5.52 eV) and electron affinity of CBP (1.89 eV) respectively. As a result, it was found that the charge transporting material (1) could be used similarly to CBP in the point of work function and electron affinity, and furthermore, could be formed into a layer by coating process.

Examples B Series

Production Example B1

<Synthesis of Charge Transporting Material>

0.80 g of phosphorus oxychloride was added into 50 mL of N,N-dimethyl formamide and stirred at room temperature to be dissolved. Herein, a solution prepared by dissolving 2.42 g of CBP in 15 mL of dry chloroform was added and stirred at room temperature to obtain formyl-product of CBP (4-(Carbazol-9-yl)-4'-(3-formylcarbazol-9-yl)-biphenyl). On the other hand, 1.83 g of triphenylphosphine was added into 50 mL of benzene to be dissolved. Then 0.67 g of bromomethane was added therein and stirred at room temperature to produce phosphonium salt. The phosphonium salt thus obtained was dissolved in 50 mL of dry diethyl ether under dry nitrogen flow, and 4.4 mL of butyl lithium solution in hexane (1.6 M) was further added and stirred at room temperature to produce phosphoylide. Then 2.18 g of the formyl-product of CBP which is dissolved in 20 mL of dry diethyl ether was further added therein to allow Wittig reaction, thereby producing vinyl-product of CBP (4-(Carbazol-9-yl)-4'-(3-vinylcarbazol-9-yl)-biphenyl).

1.8 g of the vinyl-product of CBP was dissolved in 50 mL of dry tetrahydrofuran under dry nitrogen flow, and 3 mg of azobisisobutyronitrile was further added and stirred at room temperature for 12 hours to allow polymerization. Then the reacted solution was poured into 100 mL of methanol, and solid contents therein were washed by diluted hydrochloric acid. Thereafter, soluble components were removed by means of a Soxhlet reflux condenser using acetone as the solvent to separate an insoluble fraction. This insoluble fraction was dissolved in chloroform and subjected to reprecipitation using methanol, thus obtaining a target polymer (formula (14)). Hereafter, the obtained polymer is referred as the charge transporting material (1).

Formula (14)

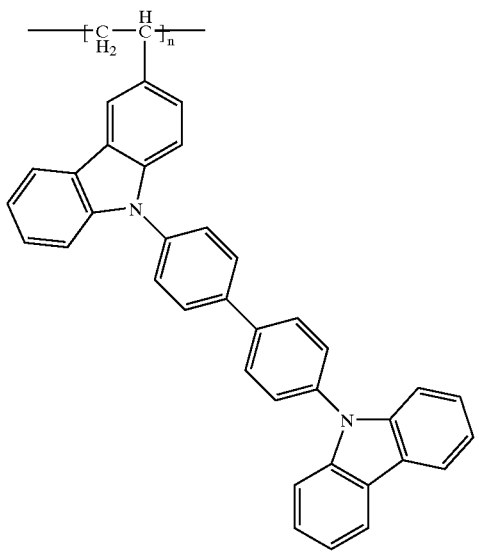

wherein, "n" is integer of 1 or more.

The charge transporting material (1) was soluble to aromatic solvents such as toluene and xylene, halogenated hydrocarbon solvents such as chloroform and 1,2-dichloroethane, and ether solvents such as tetrahydrofuran. Number average molecular weight of the charge transporting material (1) based on polystyrene standard was determined by gel permeation chromatography (GPC) using chloroform as solvent, and a determined value was $1.0 \times 10^4$. For a structure of the charge transporting material (1), corresponding spectra of 1H-NMR and IR spectrum were obtained.

Example B1

(1) Production of Organic EL Element

A glass substrate on which a transparent conductive layer of ITO was formed was subjected to patterning into a prescribed pattern, and thereafter washed and treated with UV and ozone. Then, water dispersion of poly-3,4-ethylenedioxythiophene/polystyrene sulfonate (abbreviated name: PEDOT/PSS, trade name: Baytron TP CH 8000, available from Bayer) was dropped down on the washed substrate and carrying out the spin coating. Thereafter, the substrate was heat-dried on a hot plate at 200° C. for 10 minutes to form a hole transporting layer with thickness of 80 nm.

Subsequently, the charge transporting material (1) of the production example B1 and Ir(ppy)$_3$(tris(2-phenylpyridine) iridium) were mixed into tetrahydrofuran in accordance with the following composition ratio to prepare a composition for forming electron transporting and light emitting layer. The prepared composition was dropped down on the hole transporting layer and carrying out the spin coating to form an electron transporting and light emitting layer with thickness of 90 nm.

<Composition>

| | |
|---|---|
| Charge transporting material (1) | 19 parts by weight |
| Ir(ppy)$_3$ | 1 parts by weight |
| Tetrahydrofuran | 995 parts by weight |

Further, vacuum deposition was carried out with the use of metal calcium at 0.14 nm/s of depositing speed under the vacuum condition of $5.0 \times 10^{-6}$ Torr to form a deposition layer with thickness of 10 nm, and further onto the formed deposition layer, vacuum deposition was carried out with the use of silver at 0.23 nm/s of depositing speed to form a deposition layer with thickness of 250 nm as an electrode.

The organic EL element thus obtained was used by connecting an external power source (Source meter 2400, available from Keithley Instruments, Inc.) thereto, and impressing direct current thereon with the use of the ITO electrode as the positive electrode and the metal electrode as the negative electrode, thus obtaining light emission of green color originated from Ir(ppy)$_3$.

(2) Evaluation

Figure 2:
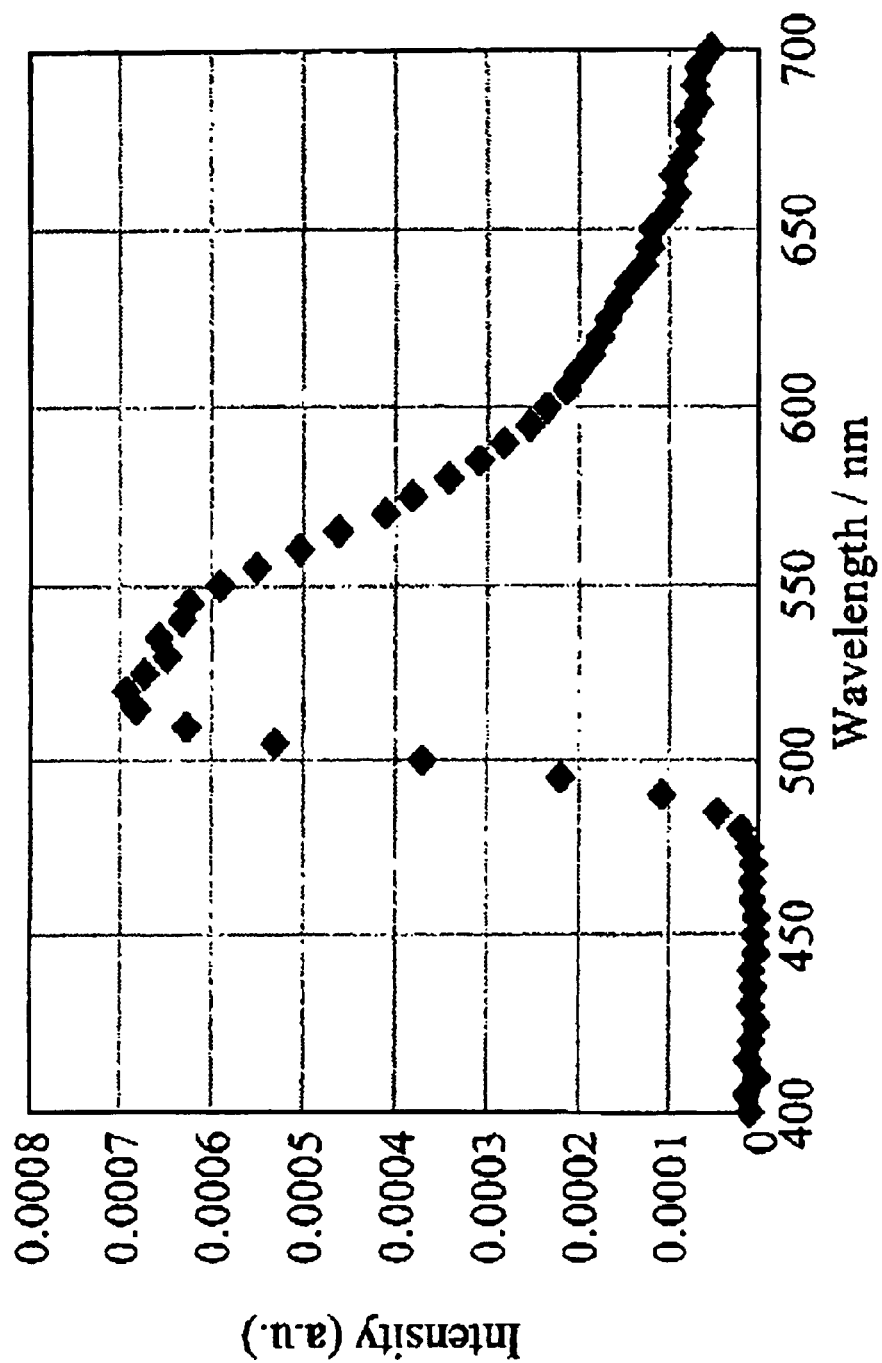
FIG. 2 is a light emission spectrum obtained in one Example of the organic EL element according to the present invention.

Intensity of the obtained element was measured by means of a luminance meter (BM-8, available from Topcon Corporation). Light emission spectrum was measured by means of a spectroradiometer (SR-2, available from Topcon Corporation), and a light spectrum measured is shown in FIG. 2.

It is found that this element started light emission at 10 V of impressed voltage, and emitted by about 3,000 cd/m$^2$ of intensity at 26 V of impressed voltage. The maximum efficiency of light emission was about 3.5 cd/A.

What is claimed is:

1. A charge transporting material comprising a compound, a molecular structure of which has at least one repeating unit represented by the following formula (1):

Formula (1)

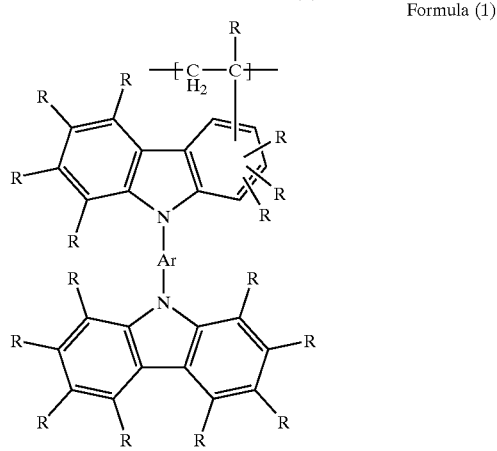

wherein, Ar is a non-substituted or substituted arylene group or a non-substituted or substituted heterocyclic group, the arylene group having 6 or more to 60 or less carbon atoms and forming a conjugated bond system extending over a region between two nitrogen atoms, the heterocyclic group having 4 or more to 60 or less carbon atoms and also forming a conjugated bond system extending over a region between two nitrogen atoms, and wherein, each R may be different or same, and selected from the group consisting of hydrogen atom, alkyl group having 1 to 20 carbon atoms, alkoxyl group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxyl group having 6 to 60 carbon atoms, arylalkyl group having 7 to 60 carbon atoms, arylalkoxyl group having 7 to 60 carbon atoms, arylalkenyl group having 8 to 60 carbon atoms, arylamino group having 6 to 60 carbon atoms, heterocyclic group having 4 to 60 carbon atoms, cyano group, nitro group, and halogen atoms.

2. The charge transporting material according to claim 1, wherein the total number of the repeating units represented by the formula (1) contained in the molecular structure of the compound is 5 to 100,000.

3. The charge transporting material according to claim 1, wherein the Ar in the formula (1) is selected from the group consisting of the structures represented by the following formulas (a) to (j):

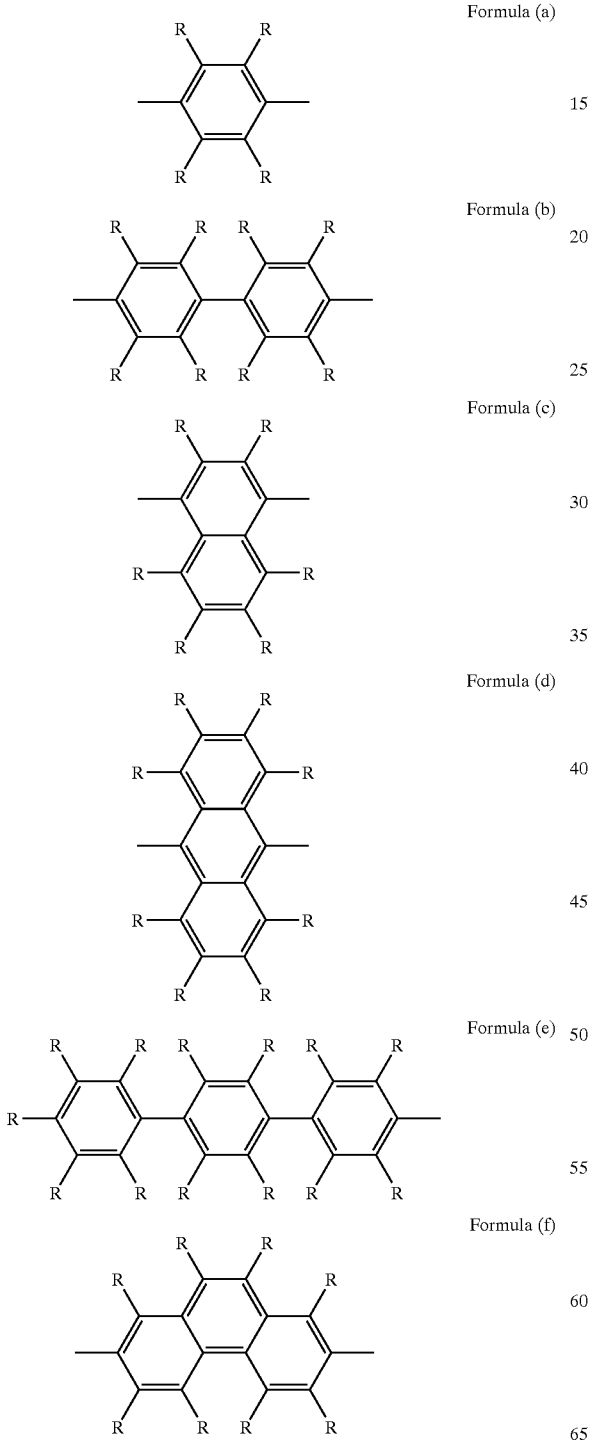

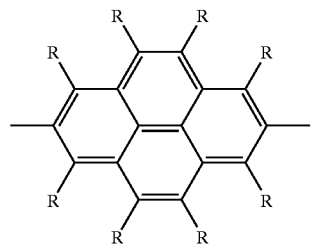

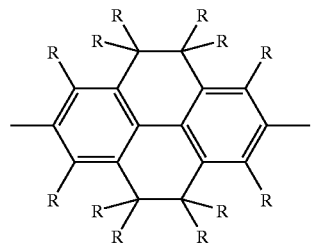

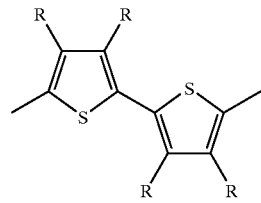

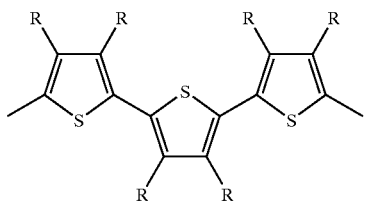

wherein, each R is same as set forth in claim 1.

4. The charge transporting material according to claim 1, wherein the repeating unit represented by the formula (1) is at least one selected from the group consisting of the structures represented by the following formulas (2) to (9):

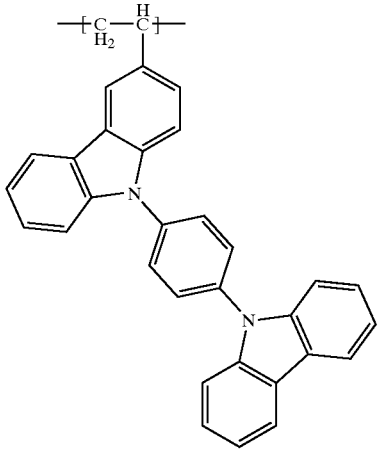

Formula (3)
Formula (4)
Formula (5)
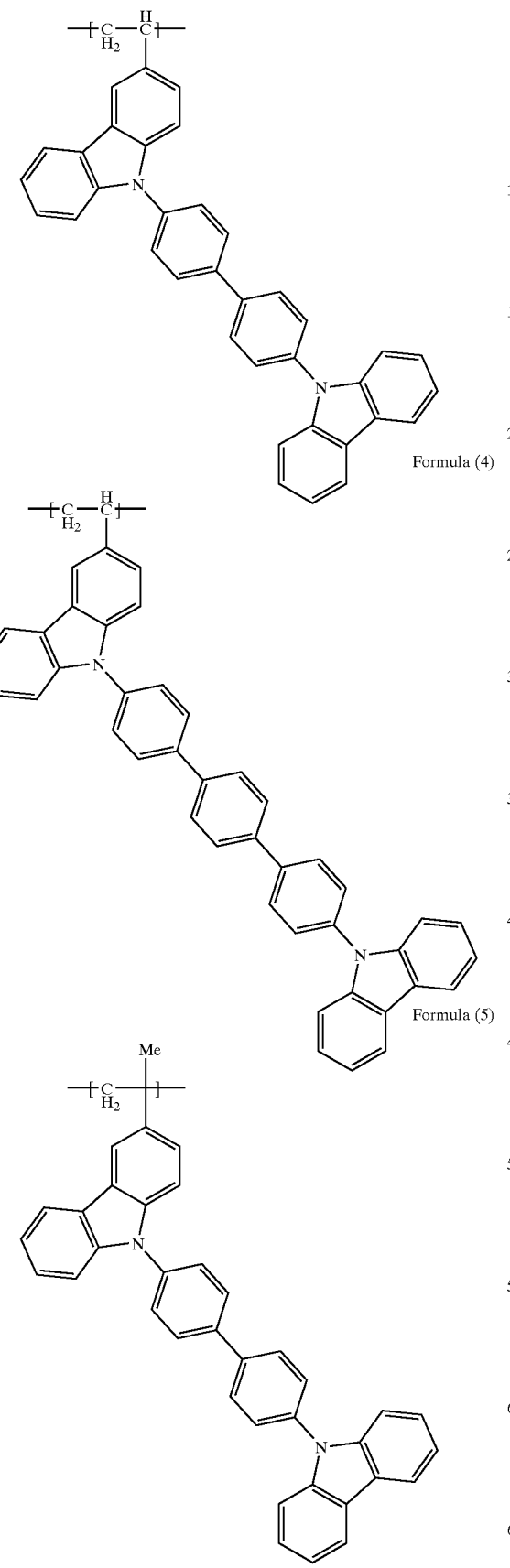
Formula (6)
Formula (7)
Formula (8)
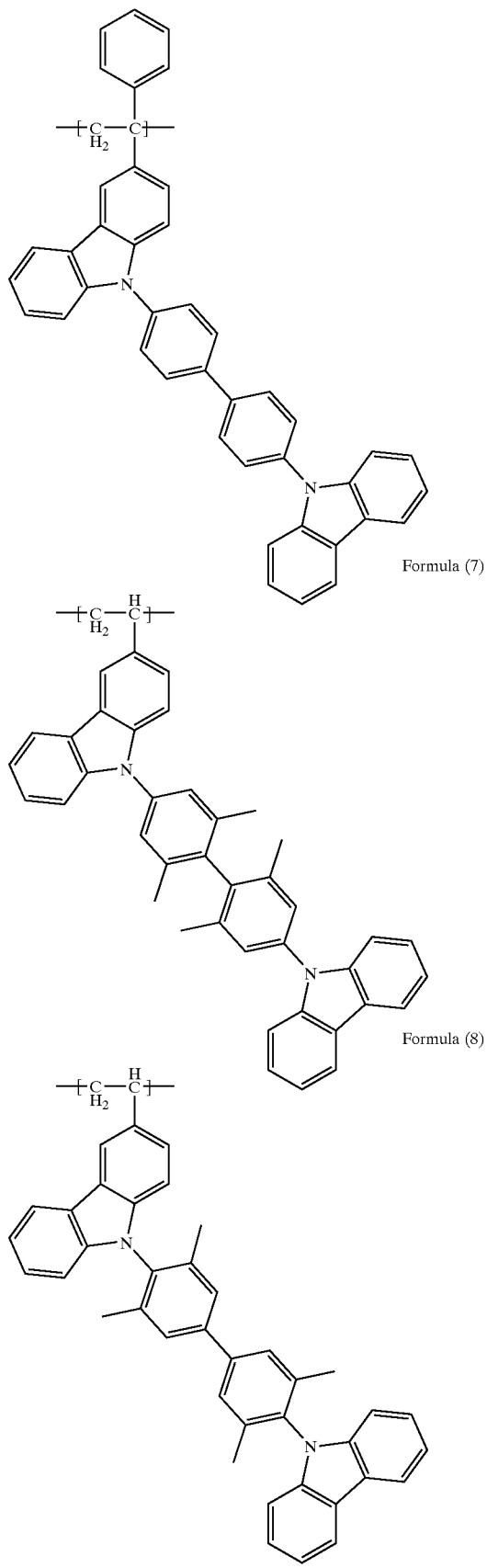

-continued

Formula (9)

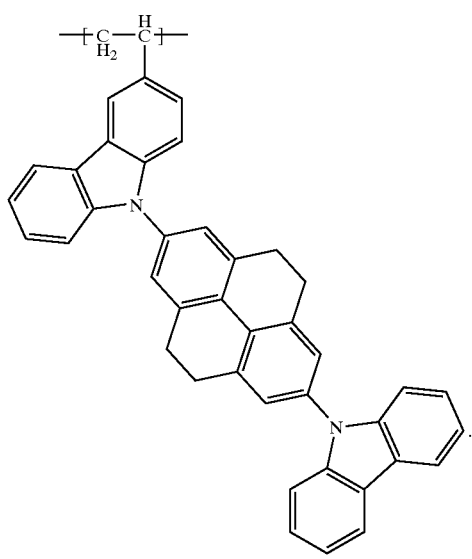

5. An organic electroluminescent element comprising a pair of electrodes and an organic compound layer having a mono-layered or multi-layered structure and disposed between the electrodes, wherein at least one layer in the organic compound layer contains at least one compound, a molecular structure of which has at least one repeating unit represented by the following formula (1):

Formula (1)

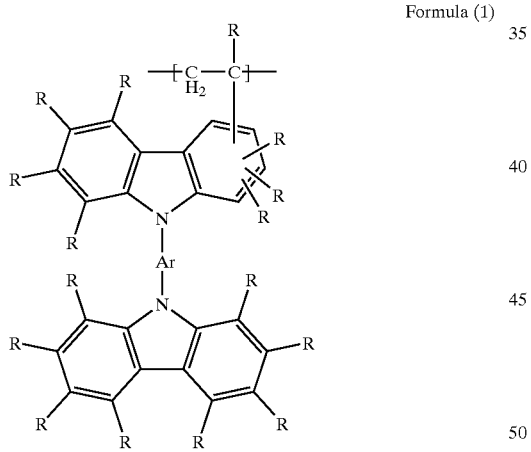

wherein, Ar is a non-substituted or substituted arylene group or a non-substituted or substituted heterocyclic group, the arylene group having 6 or more to 60 or less carbon atoms and forming a conjugated bond system extending over a region between two nitrogen atoms, the heterocyclic group having 4 or more to 60 or more carbon atoms and also forming a conjugated bond system extending over a region between two nitrogen atoms, and wherein, each R may be different or same, and selected from the group consisting of hydrogen atom, alkyl group having 1 to 20 carbon atoms, alkoxyl group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxyl group having 6 to 60 carbon atoms, arylalkyl group having 7 to 60 carbon atoms, arylalkoxyl group having 7 to 60 carbon atoms, arylalkenyl group having 8 to 60 carbon atoms, arylamino group having 6 to 60 carbon atoms, heterocyclic group having 4 to 60 carbon atoms, cyano group, nitro group, and halogen atoms.

6. The organic electroluminescent element according to claim 5, wherein the total number of the repeating units represented by the formula (1) contained in the molecular structure of the compound is 5 to 100,000.

7. The organic electroluminescent element according to claim 5, wherein the Ar in the formula (1) is selected from the group consisting of the structures represented by the following formulas (a) to (j):

Formula (a)

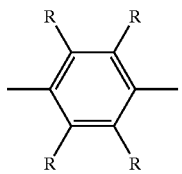

Formula (b)

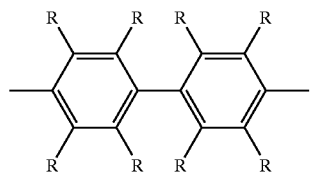

Formula (c)

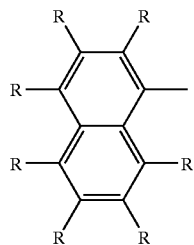

Formula (d)

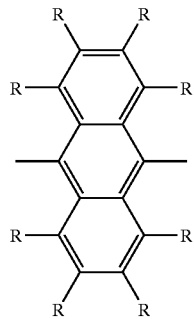

Formula (e)
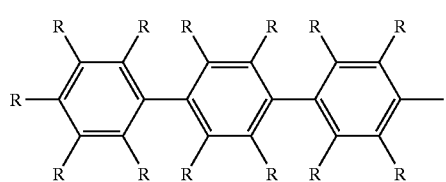
Formula (f)
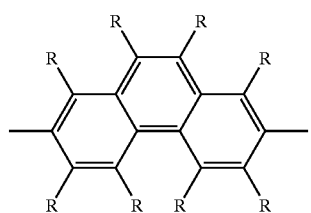
Formula (g)
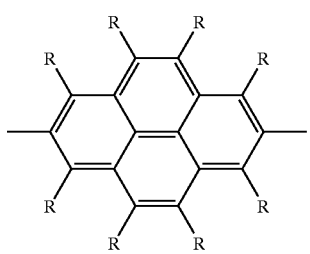
Formula (h)
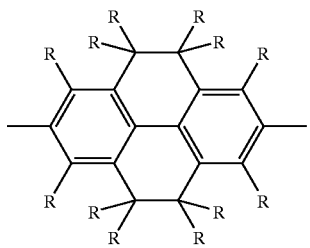
Formula (i)
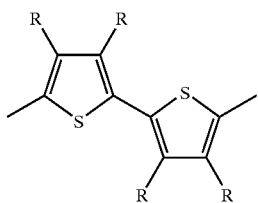
Formula (j)
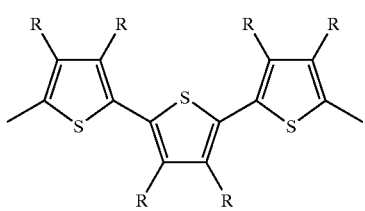
wherein, each R is same as set forth in claim 5.
8. The organic electroluminescent element according to claim 5, wherein the repeating unit represented by the formula (1) is at least one selected from the group consisting of the structures represented by the following formulas (2) to (9):
Formula (2)
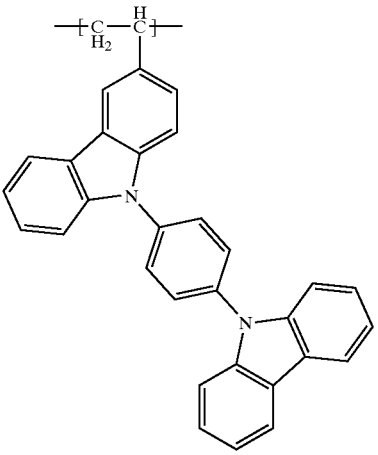
Formula (3)
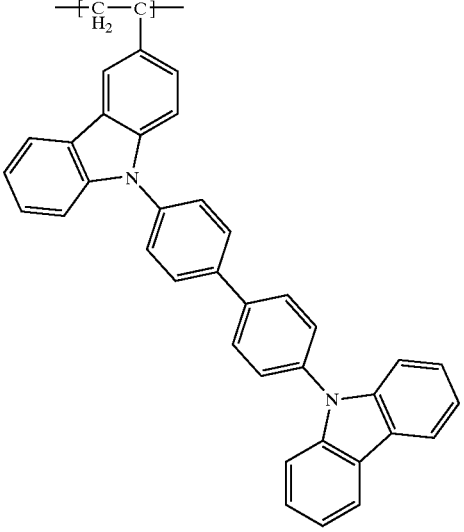
Formula (4)
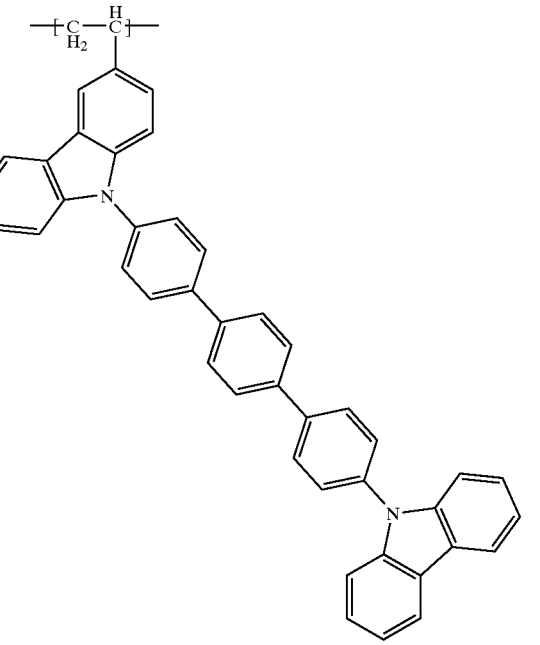

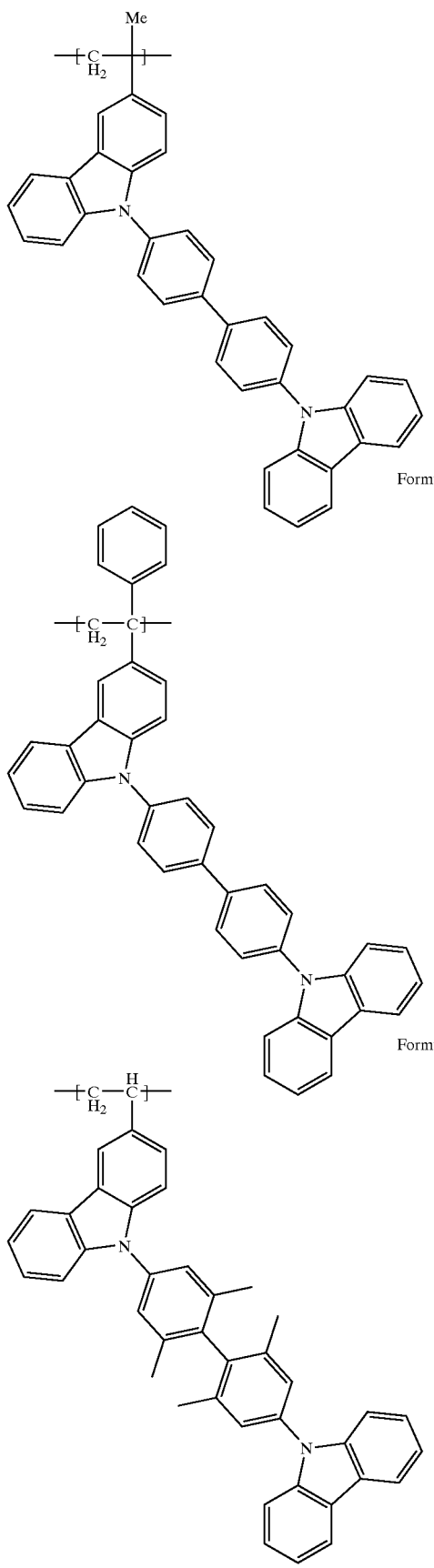

9. The organic electroluminescent element according to claim 5, wherein the organic compound layer is a light emitting layer comprising at least one light emitting material dispersed in the compound having at least one repeating unit represented by the formula (1).

10. The organic electroluminescent element according to claim 9, wherein the light emitting layer comprises a phosphorescent iridium compound as the light emitting material at 0.5 to 20% by weight.

11. The organic electroluminescent element according to claim 9, wherein a layer comprising an electron transporting compound is disposed between the light emitting layer and a negative electrode in a manner that the layer is adjacent to the light emitting layer and the negative electrode.

12. The organic electroluminescent element according to claim 9, wherein a layer comprising a hole transporting compound is disposed between the light emitting layer and a positive electrode in a manner that the layer is adjacent to the light emitting layer and the positive electrode.

13. The organic electroluminescent element according to claim 9, wherein a layer comprising an electron transporting compound is disposed between the light emitting layer and a negative electrode in a manner that the layer is adjacent to the light emitting layer and the negative electrode, and wherein a layer comprising a hole transporting compound is disposed between the light emitting layer and a positive electrode in a manner that the layer is adjacent to the light emitting layer and the positive electrode.

14. A light emitting panel provided with an organic electroluminescent element according to claim 5.

* * * * *